United States Patent
Li et al.

(10) Patent No.: US 7,355,823 B2
(45) Date of Patent: Apr. 8, 2008

(54) TA BASED BILAYER SEED FOR IRMN CPP SPIN VALVE

(75) Inventors: Min Li, Dublin, CA (US); Kunliang Zhang, Milpitas, CA (US); Chyu-Jiuh Torng, Pleasanton, CA (US); Yu-Hsia Chen, Mountain View, CA (US)

(73) Assignee: Head Way Technologies, Inc., Milpitas, CA (US)

( * ) Notice: Subject to any disclaimer, the term of this patent is extended or adjusted under 35 U.S.C. 154(b) by 468 days.

(21) Appl. No.: 11/043,839

(22) Filed: Jan. 26, 2005

(65) Prior Publication Data
US 2006/0165881 A1 Jul. 27, 2006

(51) Int. Cl.
*G11B 5/33* (2006.01)

(52) U.S. Cl. .................. 360/324.1; 29/603.13; 29/603.14

(58) Field of Classification Search .......... 360/324, 360/324.1, 324.11, 324.12, 324.2; 29/603.13, 29/603.14, 603.15
See application file for complete search history.

(56) References Cited

U.S. PATENT DOCUMENTS

| 5,627,704 | A | 5/1997 | Lederman et al. ........... 360/113 |
| 5,668,688 | A | 9/1997 | Dykes et al. ............... 360/113 |
| 5,841,611 | A * | 11/1998 | Sakakima et al. .......... 360/324 |
| 6,624,985 | B1 | 9/2003 | Freitag et al. ........... 360/324.1 |
| 7,016,170 | B2 * | 3/2006 | Nishioka ................. 360/324.2 |
| 7,130,166 | B2 * | 10/2006 | Gill ....................... 360/324.12 |
| 7,145,755 | B2 * | 12/2006 | Freitag et al. ........ 360/324.11 |
| 7,218,484 | B2 * | 5/2007 | Hashimoto et al. ...... 360/324.1 |
| 2002/0051330 | A1 | 5/2002 | Heijden et al. ............. 360/324 |
| 2003/0030945 | A1 | 2/2003 | Heinonen et al. ........ 360/324.2 |
| 2003/0128483 | A1 * | 7/2003 | Kamijo ................. 360/324.11 |
| 2004/0179311 | A1 | 9/2004 | Li et al. ................. 360/324.12 |
| 2006/0044708 | A1 * | 3/2006 | Gill ....................... 360/324.12 |

OTHER PUBLICATIONS

Co-pending U.S. Appl. No. 11/043,624, Filed Jan. 26, 2005, Ta Based Bilanger Seed for IrMn CPP SPir Valve, assigned to the same assignee as the present invention.

* cited by examiner

*Primary Examiner*—Tianjie Chen
(74) *Attorney, Agent, or Firm*—Saile Ackerman LLC; Stephen B. Ackerman

(57) ABSTRACT

The effectiveness of an IrMn pinning layer in a CPP GMR device at high switching fields has been improved by replacing the conventional single layer seed by a layer of tantalum and either ruthenium or copper. The tantalum serves to cancel out the crystallographic influence of underlying layers while the ruthenium or copper provide a suitable base on which to grow the IrMn layer.

5 Claims, 2 Drawing Sheets

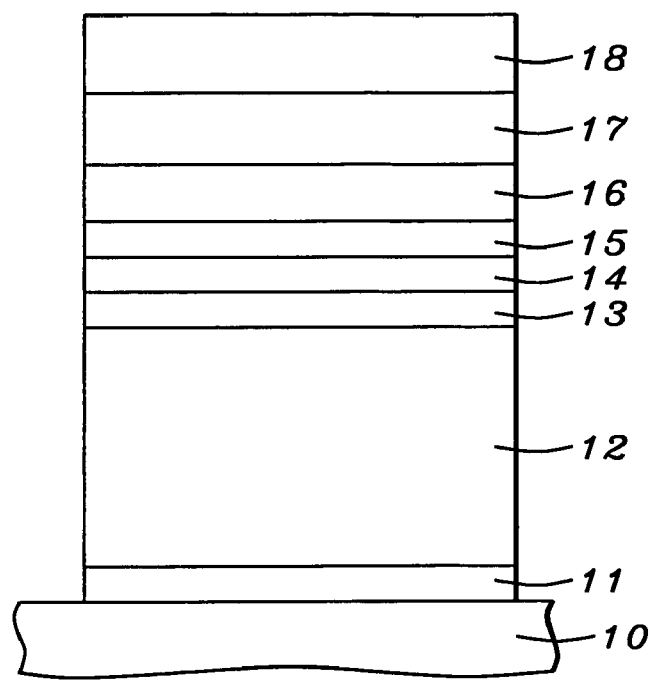
FIG. 1 - Prior Art
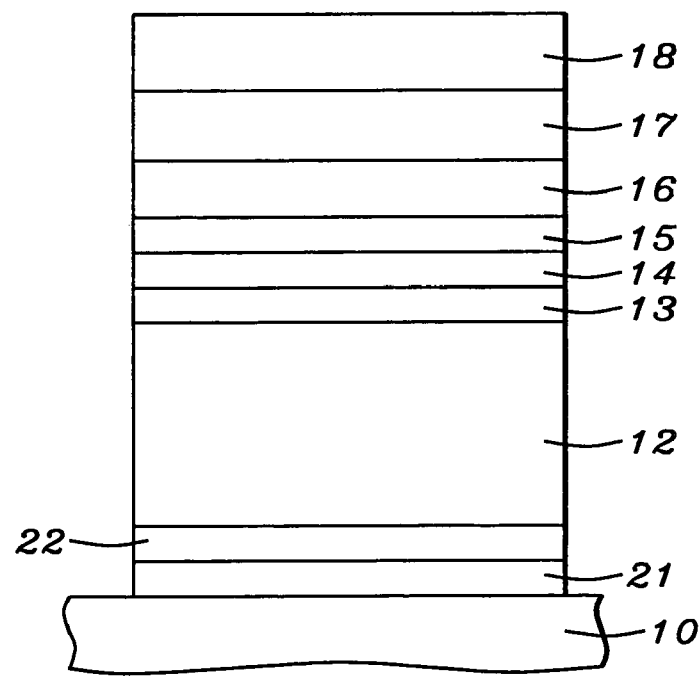
FIG. 2

TA BASED BILAYER SEED FOR IRMN CPP SPIN VALVE

This application is related to U.S. patent application Ser. No. 11/043,624 filed Jan. 26, 2005, owned by a common assignee as the instant invention.

FIELD OF THE INVENTION

The invention relates to the general field of CPP GMR devices with particular reference to the layer that seeds the pinning layer.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are seed layer 11 (lying on lower conductive lead 10) on which is antiferromagnetic layer 12 whose purpose is to act as a pinning agent for a magnetically pinned layer. The latter is a synthetic antiferromagnet formed by sandwiching antiferromagnetic coupling layer 14 between two antiparallel ferromagnetic layers 13 (AP2) and 15 (AP1).

Next is a non-magnetic spacer layer 16 on which is low coercivity (free) ferromagnetic layer 17. A capping layer such as lead 18 lies atop free layer 17. When free layer 17 is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

GMR devices may be designed so as to measure the resistance of the free layer for current flowing parallel or perpendicular to its two surfaces. The former is referred to as a CIP (current in plane) device while the latter is called a CPP (current perpendicular to plane) device.

For read head application, a CPP spin valve structure grows on a NiFe bottom shield directly, which is different from a CIP GMR reader sensor. In the latter case, the spin valve structure was grown on an insulation gap layer, typically alumina. Since NiFe is an ordered structure, it reduces the effectiveness of the seed layer/AFM combination that exists in the CIP GMR case. The present invention discloses a seed layer that is more suitable for CPP GMR spin valve structures.

A routine search of the prior art found the following references to be of interest:

In U.S. Pat. No. 6,624,985, Freitag et al. disclose a Ru/Si and NiFeCr seed layer for PtMn. In US 2004/0179311, Lin et al. (Headway) teach that a typical seed layer is Ta and NiCr. US 2003/0030945 (Heinonen et al.) shows a NiFeCr or Ta seed layer while US 2002/0051330 (Heijden et al.) shows a seed layer that may comprise Cu.

SUMMARY OF THE INVENTION

It has been an object of at least one embodiment of the present invention to provide a CPP GMR device having improved pinning by an IrMn AFM layer, particularly in the presence of high switching fields.

Another object of at least one embodiment of the present invention has been to provide a process for manufacturing said CPP device.

Still another object of at least one embodiment of the present invention has been that said process be compatible with existing processes for the manufacture of CPP devices.

These objects have been achieved by replacing the conventional single layer seed by a layer of tantalum and either ruthenium or copper. While the tantalum serves to cancel out the crystallographic influence of an underlying NiFe layer, the ruthenium or copper provide a suitable base on which to grow an IrMn layer without introducing any problems of a magnetic nature. In particular, the pinning strength of the IrMn in the presence of a high field environment is significantly increased.

BRIEF DESCRIPTION OF THE DRAWINGS

FIG. 1 shows a GMR stack of the prior art which has a conventional.

FIG. 2 shows a GMR stack according to the teachings of the present invention.

DESCRIPTION OF THE PREFERRED EMBODIMENTS

Figure 3:
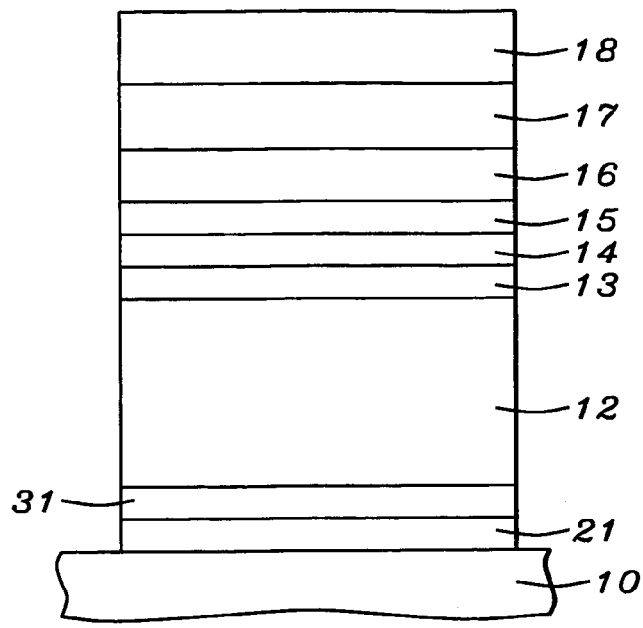
FIG. 3 is the same as FIG. 2 with a different seed layer.

Ta has traditionally been used to prevent propagation of the ordered structure of the bottom shield. Ta/NiFe was then used as the seed layer for IrMn, but the presence of the magnetic layer NiFe, between the Ta and the IrMn, can interfere with the magnetic performance, which is not desirable. This problem is overcome in the present invention.

Referring now to FIG. 2, we provide a description of the process of the present invention. In the course of this description, the structure of the present invention will also become apparent.

The process begins with what is also its key novel feature, namely the formation of the seed structure onto which is to be deposited pinning layer 12. Instead of a single seed layer, a bilayer structure comprising tantalum layer 21 (between about 20 and 70 Angstroms thick) and ruthenium layer 22 (between about 10 and 50 Angstroms thick) is used. As noted earlier, the tantalum prevents propagation of any structural influence from layer 12 while the ruthenium layer re-establishes a structural foundation to influence the growth of antiferromagnetic layer 12 of IrMn, but without introducing complications of a magnetic nature. Layer 12 is deposited to a thickness between 50 and 100 Angstroms.

Layer 13 (known as AP2 which is typically a low coercivity bilayer of $FeCo_3$ on FeCo to a total thickness of 20 to 50 Angstroms), the first of the two antiparallel layers that will form the synthetic AFM pinned layer, is then deposited onto layer 12. This is followed by layer of AFM coupling material 14, to a thickness of between 4 and 10 Angstroms, and then AP1 layer 15 (also having low coercivity)is deposited thereon to a thickness between 20 and 50 Angstroms. The antiparallel orientations of AP1 and AP2 relative to one another will be effected later through use of a suitable magnetic anneal step.

Next, non-magnetic spacer layer 16 (Cu1/AlCu/OX/Cu2 NOL; Cu1 1-10 Å; AlCu 4-12 Å; Cu2 1-10 Å; NOL=nano-oxide layer; OX=plasma etch at 20 W in 50 sccm Ar for 35 sec., followed by plasma oxidation at 27 W in 50 sccm Ar/1 sccm $O_2$ for 30 sec.) is deposited on AP1 layer 15 followed by the formation of free layer 17. The latter is typically CoFe/NiFe deposited to a thickness of between about 30 and 70 Angstroms. The process concludes with the deposition of capping layer 18 on free layer 17, typically Cu/Ru/Ta/Ru deposited to a thickness of between about 35 and 170 Angstroms.

The structure and process represented in FIG. 3 are the same as for FIG. 2 except that the seed now comprises copper layer 31 (between about 10 and 50 Angstroms thick) on tantalum layer 21 (between about 20 and 70 Angstroms thick).

Confirmatory Results

Figure 4:
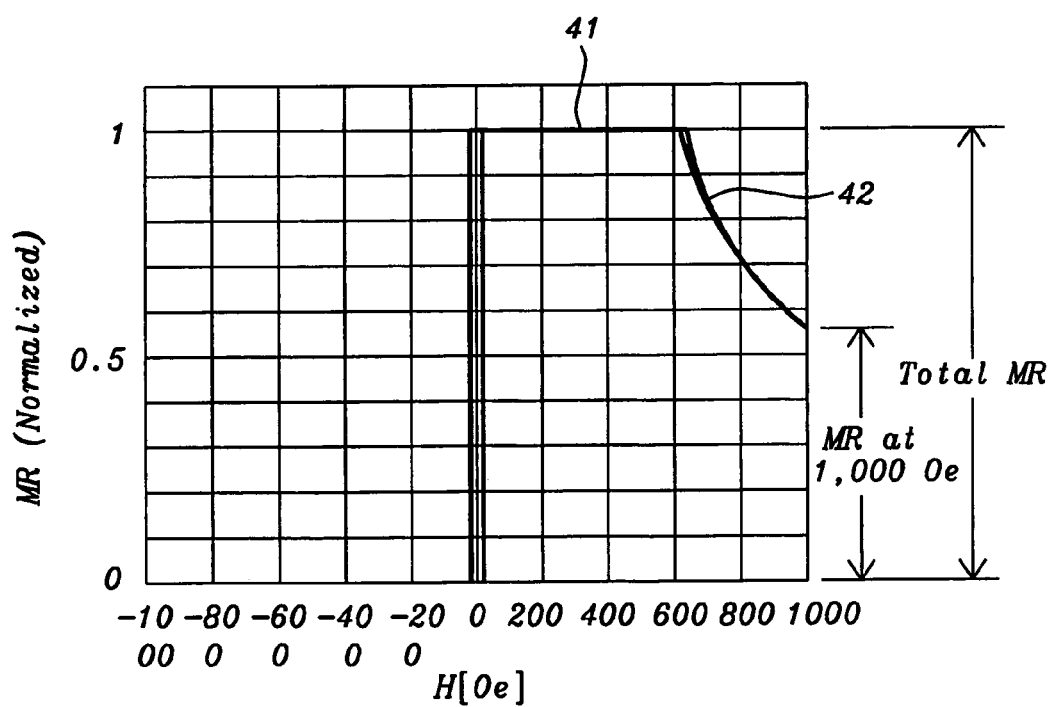
FIG. 4 is a plot of the magneto-resistance as a function of applied field.

The most visible way in which the new seed layer structure will manifest its influence on device performance is in an increased value of Rhin. This quantity is defined in FIG. 4 where we show a plot of (normalized) magneto-resistance MR as a function of an applied magnetic field (e.g. the switching field used during device operation). The maximum MR is seen to appear almost immediately at very low fields (curve 41). It remains constant till a field of about 600 Oe is reached, at which point it begins a gradual decline (curve 42). Rhin is then defined as the percentage (of the maximum MR) of the MR at 1,000 Oe.

If the process described above was correctly used to form the device, it will be found to have a GMR ratio of at least 5%, an R.A product no greater than about 0.4, and an $Rh_{in}$ of at least 90%. To confirm this, four samples (one reference and three having the new seed structure) were prepared and then evaluated for CPP GMR value, R.A product, and Rhin:

The results are summarized in TABLE I below
A. referenceTa5/NiCr45/IrMn70/Fe(25%)Co36/Ru7.5/[Fe(25%)Co12/Cu2]2/Fe(25%)Co12/Cu2.6/AlCu8/OX/Cu2/CoFe12/NiFe35/Cu30/Ru10Ta60/Ru10
B. Ta50/Ru20/IrMn70/Fe(25%)Co38/Ru7.5/[Fe(25%)Co12/Cu2]2/Fe(25%) Co12/Cu3.2/AlCu8.5/OX/Cu2.0/CoFe12/NiFe35/Cu30/Ru10/Ta60/Ru10
C. Ta50/Ru20/IrMn70/Fe(25%)Co50/Ru7.5/[Fe(25%)Co60/Cu2]2/Fe(25%)Co16/Cu3. 2/AlCu8.5/OX/Cu2.0/CoFe12/NiFe35/Cu30/Ru10/Ta60/Ru10
D. Ta50/Cu20/IrMn70/Fe(25%)Co38/Ru7.5/[Fe(25%)Co12/Cu2]2/Fe(25%)Co 12/Cu2.6/AlCu8.0/OX/Cu2.0/CoFe12/NiFe35/Cu30/Ru10/Ta60/Ru10

The results are summarized in TABLE 1 below

TABLE I

| Sample | Seed | CPP GMR | RA | Rhin |
| --- | --- | --- | --- | --- |
| A | Ta5/NiCr45 | 5.5% | 0.34 ohm · µm² | 50% |
| B | Ta50/Ru20 | 5.8% | 0.38 ohm · µm² | 92% |
| C | Ta50/Ru20 | 6.2% | 0.24 ohm · µm² | 78% |
| D | Ta50/Cu20 | 4.7% | 0.18 ohm · µm² | 92% |

It is readily seen that when the conventional Ta—NiCr seed layer was replaced by Ta/Ru or Ta/Cu, there was a significant increase in Rhin with no change in either the CPP GMR ratio or the resistance area product. This confirms that the relative pinning strength of the IrMn in an SV, formed according to the present invention, is much larger than in devices based on earlier approaches.

What is claimed is:

1. A process to manufacture a CPP GMR device, comprising:
    depositing, on a substrate, a layer of Ta to a thickness of between 20 and 70 Angstroms, followed by a layer of Ru to a thickness of between 10 and 50 Angstroms;
    then depositing on said Ru layer a pinning layer of IrMn to a thickness of between about 50 and 100 Angstroms;
    on said pinning layer, depositing a pinned layer;
    depositing a non magnetic spacer layer on said pinned layer;
    on said non magnetic spacer layer, depositing a free layer; and
    on said free layer, depositing a capping layer of Cu/Ru/Ta/Ru to a thickness of between about 35 and 170 Angstroms, thereby forming said device.

2. The process recited in claim 1 wherein said pinning layer of IrMn is deposited to a thickness of between about 50 and 100 Angstroms.

3. The process recited in claim 1 wherein the step of depositing said pinned layer further comprises:
    on said pinning layer of IrMn, depositing a first low coercivity ferromagnetic bilayer of FeCo3on FeCo to a thickness of between about 20 and 50 Angstroms;
    on said first ferromagnetic bilayer, depositing an antiferromagnetic coupling layer to a thickness of between about 4 and 10 Angstroms;
    on said antiferromagnetic coupling layer, depositing a second low coercivity ferromagnetic layer to a thickness of between about 20 and 50 Angstroms; and
    then causing said first and second ferromagnetic layers to be magnetically antiparallel to each other.

4. The process recited in claim 1 wherein said free layer is CoFe/NiFe deposited to a thickness of between about 30 and 70 Angstroms.

5. The process recited in claim 1 wherein said substrate is a lower lead for said CPP GMR device.

* * * * *

UNITED STATES PATENT AND TRADEMARK OFFICE
CERTIFICATE OF CORRECTION

PATENT NO. : 7,355,823 B2 Page 1 of 1
APPLICATION NO. : 11/043839
DATED : April 8, 2008
INVENTOR(S) : Min Li et al.

It is certified that error appears in the above-identified patent and that said Letters Patent is hereby corrected as shown below:

Title Page
In the Assignee (73) delete "Head Way Technologies, Inc." and replace with --Headway Technologies, Inc.--

Signed and Sealed this

Thirteenth Day of January, 2009

JON W. DUDAS
*Director of the United States Patent and Trademark Office*